United States Patent
Sohn et al.

(12)

(10) Patent No.: US 6,456,551 B2
(45) Date of Patent: Sep. 24, 2002

(54) SEMICONDUCTOR MEMORY DEVICE HAVING PREFETCH OPERATION MODE AND DATA TRANSFER METHOD FOR REDUCING THE NUMBER OF MAIN DATA LINES

(75) Inventors: Kyo-Min Sohn, Seoul; Yong-Hwan Noh, Kwachon, both of (KR)

(73) Assignee: Samsung Electronics Co., Ltd., Gyconggi-do (KR)

( * ) Notice: Subject to any disclaimer, the term of this patent is extended or adjusted under 35 U.S.C. 154(b) by 0 days.

(21) Appl. No.: 09/846,156

(22) Filed: Apr. 30, 2001

(30) Foreign Application Priority Data

May 22, 2000 (KR) ............................................. 00-27402

(51) Int. Cl.[7] .................................................. G11C 7/00
(52) U.S. Cl. .................................. 365/219; 365/189.05
(58) Field of Search ................................ 365/219, 220, 365/221, 189.05

(56) References Cited

U.S. PATENT DOCUMENTS

| | | | | |
|---|---|---|---|---|
| 4,450,538 A | * | 5/1984 | Shirasaka | .................... 365/219 |
| 4,718,039 A | * | 1/1988 | Aichelmann, Jr. et al. | .. 365/219 |
| 4,945,518 A | * | 7/1990 | Muramatsu et al. | ........ 365/219 |
| 5,828,618 A | * | 10/1998 | Hosotani et al. | ............ 365/219 |
| 5,854,767 A | * | 12/1998 | Nishi et al. | ................. 365/219 |
| 6,327,206 B2 | * | 12/2001 | Kubota et al. | .............. 365/219 |

* cited by examiner

Primary Examiner—Tan T. Nguyen
(74) Attorney, Agent, or Firm—Marger Johnson & McCollom, P.C.

(57) ABSTRACT

A synchronous semiconductor memory device includes a plurality of main data lines each coupled between a block sense amplifier array and a data output buffer. Each main data line prefetches a plurality of cell data segments from memory cells corresponding to an input/output port and transmits the cell data to the data output buffer. The memory device also includes a pass/latch part connected to one or more corresponding block sense amplifiers within a corresponding block sense amplifier array. The pass/latch part receives a plurality of cell data segments in parallel from the block sense amplifiers and transmits them in series to a corresponding main data line. This invention reduces a chip size and peak electric current of the semiconductor device by minimizing the number of main data lines required for prefetch operations.

20 Claims, 5 Drawing Sheets

DDR:DOUBLE DATA RATE

SDR:SINGLE DATA RATE

SEMICONDUCTOR MEMORY DEVICE HAVING PREFETCH OPERATION MODE AND DATA TRANSFER METHOD FOR REDUCING THE NUMBER OF MAIN DATA LINES

BACKGROUND OF THE INVENTION

1. Field of the Invention

The present invention relates to a semiconductor memory device, and more particularly, to a synchronous semiconductor memory device having a prefetch operation mode, which is capable of minimizing the number of main data lines.

2. Discussion of Related Art

Electronic systems, such as computers, are being used in almost every aspect of business and home life. These computers are becoming faster and are increasing in their storage capacity. Memory devices for these systems also need to increase in speed and in storage capacity. To realize an increase in both speed and memory storage capacity, semiconductor memory devices used in these electronic systems need to have a higher degree of integration and increased data transmission rates. To increase the rate of data transmission, both a double data rate (DDR) system and a pipelined burst system have been disclosed in the prior art. In each of these prior art systems, a prefetch operation reads the data internally from a memory cell before the data is to be output externally.

In a semiconductor memory operating at a double data rate (FIG. 5 shows signals used to drive DDR systems), two or more data segments are successively output from a single input/output (I/O) port during a single read period. To do this, the data segments must be prefetched because it is difficult to perform two read operations during one period. In other words, two or more data segments must be read from the memory cell and latched to an interior latch before being externally outputted. The data must also be able to be outputted right away through the I/O port when a clock for a data output is provided. In a single data rate (SDR) system (FIG. 6 shows signals used to drive SDR systems), by contrast, only one data is output per I/O port per read period.

FIG. 1 depicts a block diagram of a read section of a semiconductor memory device according to the prior art. Several problems with the prefetch operation in the conventional systems will become apparent from the following description of the prior art made with reference to FIG. 1. As shown in FIG. 1, a conventional read section of a memory device includes a memory cell array divided into block units. Each memory cell array block 10–10n corresponds to one of the block sense amplifier arrays 20–20n. An output line from each block sense amplifier array 20–20n is connected to a corresponding one of a plurality of main data lines L1–Ln. Each of the main data lines L1–Ln is, in turn, connected to a corresponding one of the data output buffers 30–30n.

A data read operation in the device constructed as shown in FIG. 1 is as follows. Data read from memory cells within a selected one of the memory cell array blocks 10–10n is amplified through a corresponding one of the block sense amplifiers 20–20n. For example, if a first sense amplifier of the block sense amplifier array 20 operates, then the data amplified in the block sense amplifier array 20 enters the data output buffer 30 through the main data line L1. To provide a double data rate, the data must enter the data output buffer before a clock for data output is provided.

Unfortunately, in a semiconductor device having the structure of FIG. 1, the prefetched data cannot be transmitted to the data output buffer through the main data line L1 which is already being used. Another main data line is therefore required to transfer the prefetched data. Because of this, to enable a prefetch operation, the number of main data lines in the prior art systems needs to be multiplied by the number of data segments that are to be outputted per I/O port per read cycle.

Also unfortunately, an increase in the number of main data lines increases the area occupied by the read circuit within a chip and hence the overall size of the chip. This increase in chip size also increases the cost of producing the chips and hence the corresponding price for the products incorporating those chips. Furthermore, because a charge or discharge operation must be performed to drive the main data lines to their high or low levels, the peak electric current increases with an increase in the number of main data lines resulting in an increase in the electric power consumption by the chip.

Accordingly, the industry requires a technique for increasing the data rate of a semiconductor memory device without increasing chip size or power consumption. A prefetch system and method that does not require an increase in the number of main data lines would be ideal.

SUMMARY OF THE INVENTION

According to the needs of the industry, the present invention enables a semiconductor memory device that substantially overcomes several disadvantages of the prior art.

A primary object of the present invention is to provide a semiconductor device capable of increasing a data read rate of the semiconductor memory device without substantially increasing the size or power consumption of the device.

Another object of the present invention is to provide a semiconductor memory device that includes a prefetch operation mode and a data transmitting method with a reduced number of main data lines as compared to the prior art.

A further object of the present invention is to provide a semiconductor memory device and a data transmitting method therefor, which includes a prefetch operation mode capable of optimizing the number of main data lines.

A still further object of the invention is to provide a double data rate type semiconductor memory device and a data transmitting method therefor, in which a chip size and a consumption of peak electric current are minimized.

An additional object of the invention is to provide a static random access memory (SRAM) device capable of performing a prefetch operation without increasing the number of data lines.

To achieve these and other advantages, a semiconductor memory device having a prefetch operation mode and a data transfer method for reducing the number of main data lines is provided. Similar to the prior art, the semiconductor memory device according to a first preferred embodiment of this invention has a plurality of main data lines connected between the block sense amplifier arrays and the data output buffers. The block sense amplifiers prefetch cell data from numerous memory cells and transmit the data to the main data lines. Each main data line corresponds to one input/output port.

Unlike the prior art, however, a pass/latch part is arranged in communication with a back (downstream) portion of the block sense amplifier, and is connected between the block sense amplifier and a corresponding main data line. The pass/latch part receives multiple cell data segments in parallel from the block sense amplifiers and transmits them in series to the corresponding main data line. In this manner, a plurality of cell data segments are separated through the pass/latch part, and are transmitted to the same main data line. In other words, according to this invention, a plurality of cell data segments can be prefetched and transmitted through a single main data line, to thereby reduce the number of main data lines required to perform a prefetch operation.

BRIEF DESCRIPTION OF THE ATTACHED DRAWINGS

The foregoing objects, features, and advantages of the invention, along with other features and advantages, will become more readily apparent from the following detailed description of the preferred embodiments, made with reference to the attached drawings—in which like numerals refer to like elements—wherein.

Figure 5:
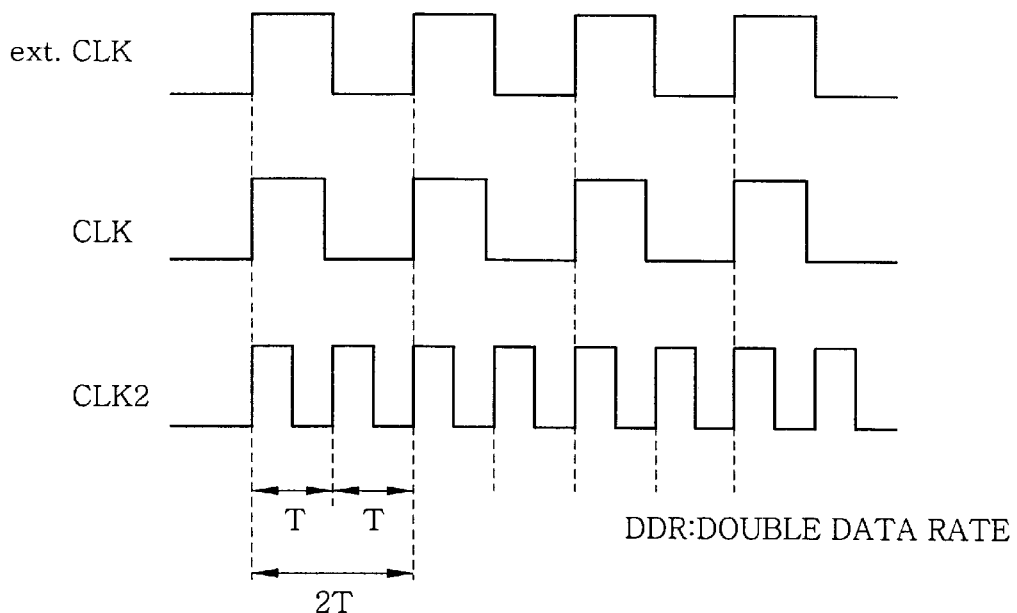
Figure 6:
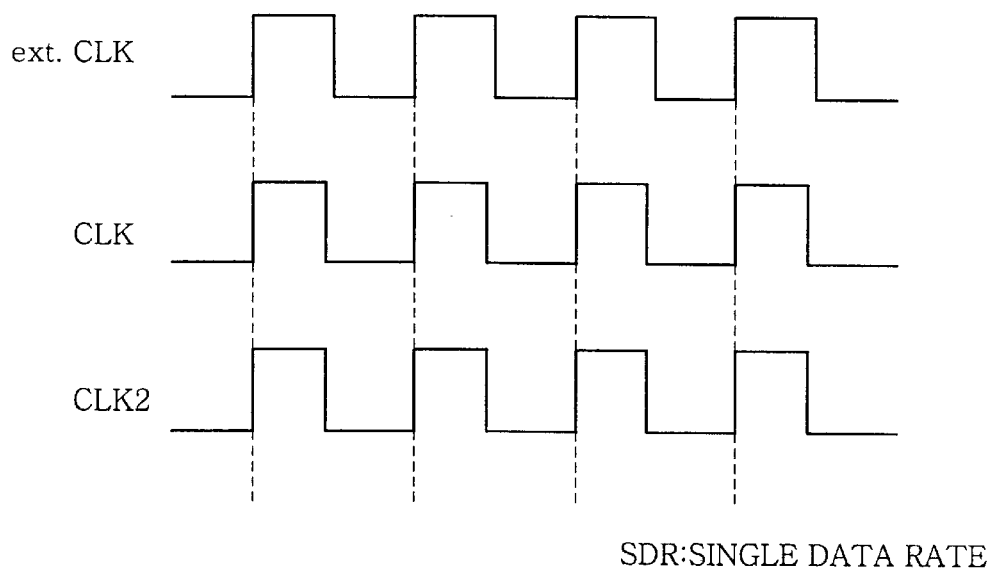

FIG. 5 contains waveform diagrams of timing signals for driving a general double data rate (DDR) system; and FIG. 6 contains waveform diagrams of timing signals used in driving a general single data rate (SDR) system.

DETAILED DESCRIPTION OF THE PREFERRED EMBODIMENTS

Figure 1:
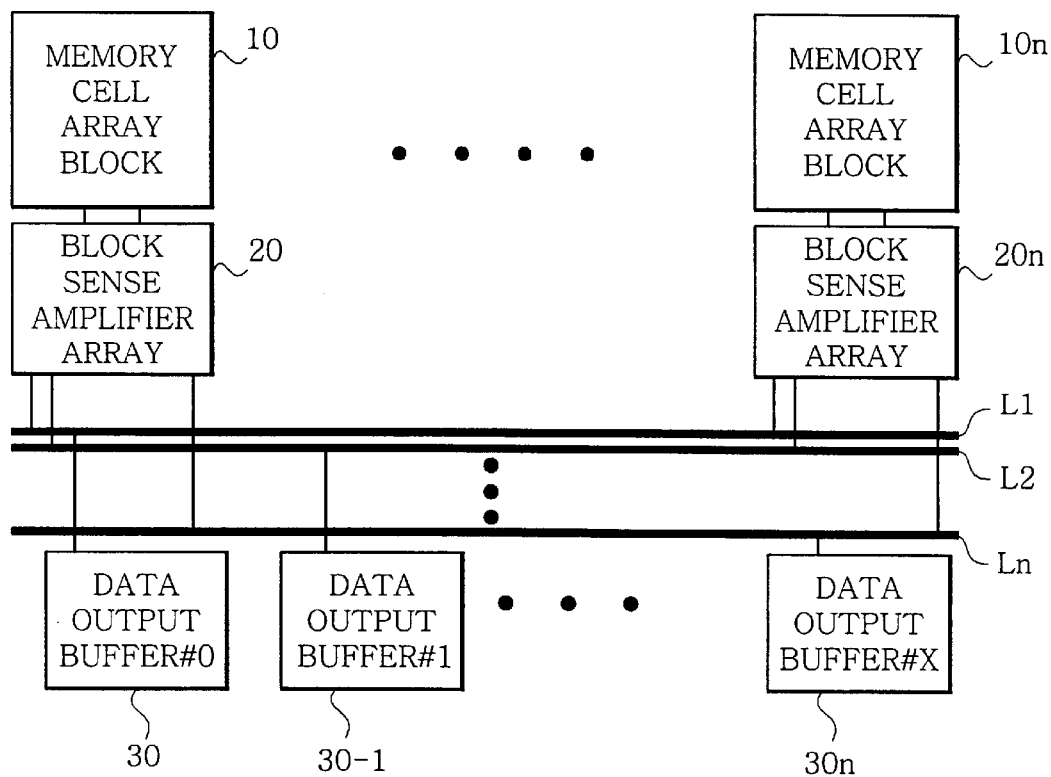
FIG. 1 is a block diagram illustrating the general construction of a read circuit of a conventional semiconductor memory device.
Figure 2:
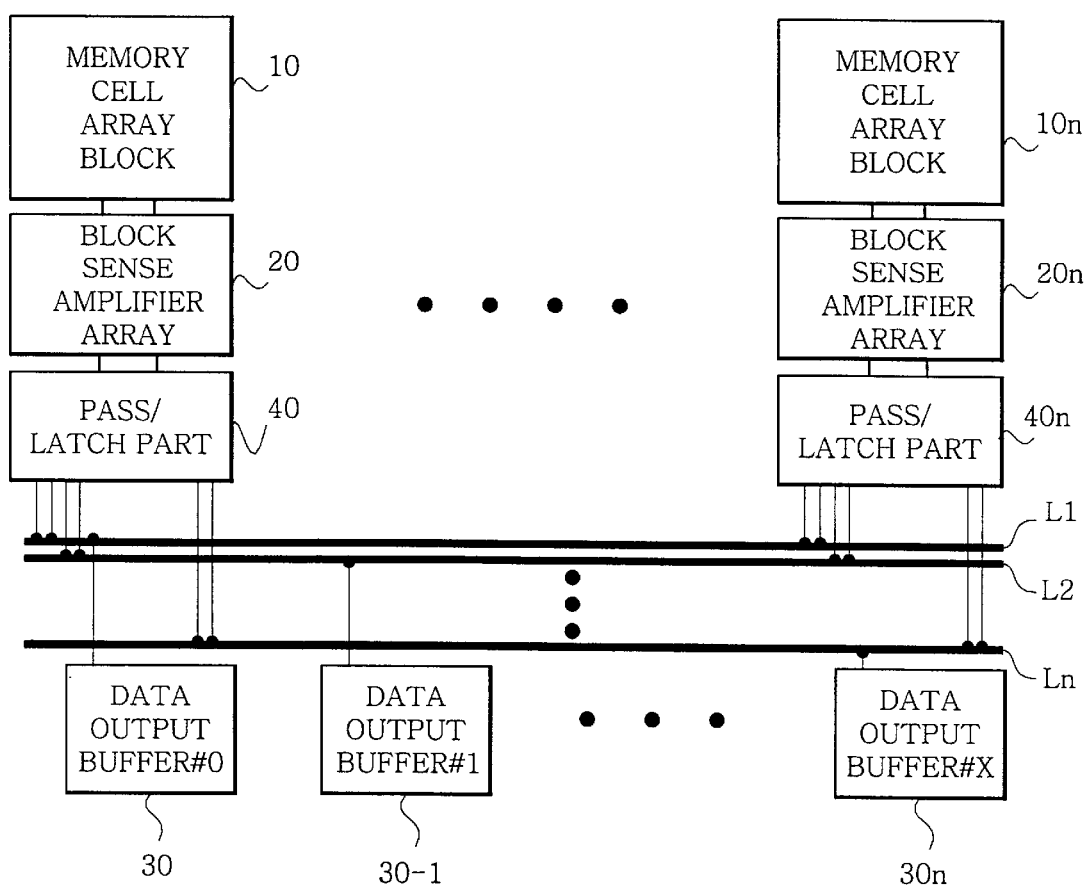
FIG. 2 is a block diagram illustrating the general construction of a read circuit of a semiconductor memory device in accordance with a first preferred embodiment of the present invention.

Referring to FIG. 2, a read circuit for a semiconductor memory device according to a first preferred embodiment of the invention includes a plurality of memory cell array blocks 10–10*n*. Block sense amplifier arrays 20–20*n* and data output buffers 30–30*n* are also provided. The memory cell array blocks 10–10*n*, block sense amplifier arrays 20–20*n*, and data output buffers 30–30*n*, each have the same general construction as the prior art circuit shown in FIG. 1.

Unlike the prior art, however, one of a plurality of pass/latch parts 40–40*n* is installed in a rear (downstream) portion of each block sense amplifier in the block sense amplifier array 20–20*n*. More particularly, each of the pass/latch parts 40–40*n* is connected between a corresponding one of the block sense amplifier arrays 20–20*n* and a corresponding one of the main data lines L1–L*n*. Each of the pass/latch parts 40–40*n* receives a plurality of cell data segments in parallel from the respective block sense amplifier and transmits them in series to the corresponding main data line. When the circuit is constructed according to the configuration described here, there is no need to increase the number of main data lines to provide a prefetch capability.

Figure 3:
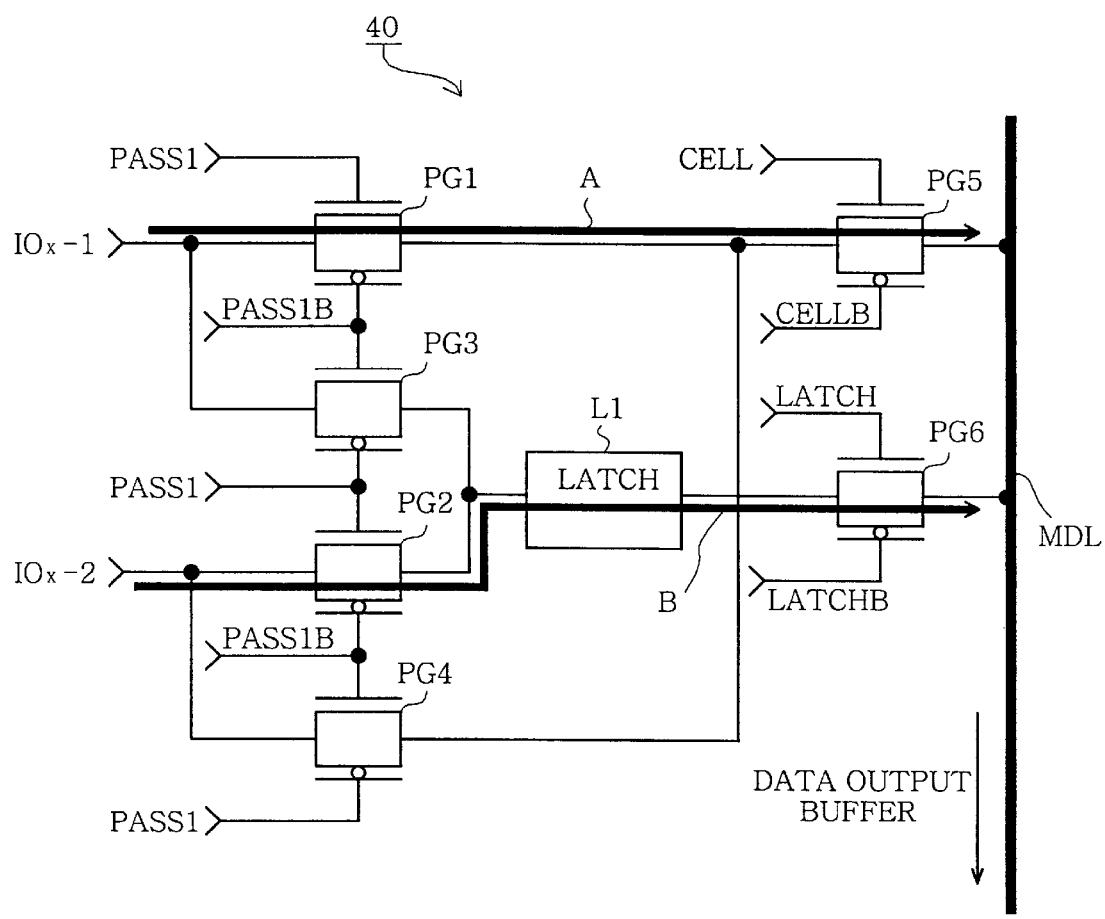
FIG. 3 is a schematic circuit diagram of a representative one of the pass/latch parts of the read circuit shown in FIG. 2.

FIG. 3 provides a schematic circuit diagram of a representative pass/latch part 40 of the plurality of pass/latch parts 40–40*n* of the read circuit of FIG. 2. Referring to FIG. 3, the pass/latch part 40 includes a first transmission (or path) gate PG1 and a second transmission (or path) gate PG2. The first and second transmission gates PG1 and PG2 transmit cell data segments from among a plurality of cell data segments through the pass/latch part 40 to the corresponding main data line MDL in response to a first logic state of a pass control signal PASS1. A third transmission (or path) gate PG3 and a fourth transmission (or path) gate PG4 transmit cell data segments to the corresponding main data line MDL in response to a second logic state of the pass control signal PASS 1.

A latch L1 operatively connects to either the second or third transmission gate PG2 or PG3, respectively. Thus, the latch L1 receives and latches a cell data segment from the connected transmission gate PG2 or PG3. A fifth transmission (or path) gate PG5 transmits the cell data received through either the first or fourth transmission gates PG1 or PG4 to a main data line MDL in response to a first logic state of a cell signal CELL applied as a control signal. And a sixth transmission (or path) gate PG6 transmits the latched cell data output from the latch L1 to the main data line MDL in response to a first logic state of a latch signal LATCH applied as a control signal when the cell signal CELL maintains its own second logic state.

The pass/latch part 40 according to this embodiment provides two data paths. As described above, data from the block sense amplifier array is applied to the pass/latch part 40. The data to be outputted first is transmitted to the main data line MDL through a first path A that runs through the first transmission gate PG1 and the fifth transmission gate PG5. The data to be outputted in the next half-period or full period (as desired) is transmitted to the main data line MDL through a second path B that runs through the second transmission gate PG2, the latch L1, and the sixth transmission gate PG6.

More specifically, when the pass control signal PASS1 is at a high logic level and the control signal CELL is also at a high logic level, data IOx-1 outputted from a first block sense amplifier is passed directly through the first path gate PG1 and the fifth path gate PG5 to the main data line MDL. Data Iox-2 outputted from another block sense amplifier is applied to the latch L1 via the second path gate PG2. The data applied to the latch L1 is latched until the control signal LATCH becomes a high logic level. The latched data is applied to the main data line MDL through the sixth path gate PG6 only when the control signal LATCH becomes logic high.

In a read operation, during a first period (or half-period in a DDR system), the control signal CELL is at the high logic level and the control signal LATCH is at a low logic level. In the next period (or next half-period in a DDR system) the control signal LATCH transitions to the high level. Data on two paths A and B can consequently be transmitted to the data output buffer via one main data line MDL, thereby reducing the number of main data lines and the peak electric current. The data transmission through these two paths A and B to the main data line MDL is initiated by the clock signal (as shown in FIGS. 5 and 6 for an DDR and SDR system, respectively). The clock signals can provide a single data rate SDR by using respective different periods (see FIG. 6) or a double data rate DDR by dividing one period into respective halves (see FIG. 5).

The circuit construction described above can be used to provide two or four (or more) bit data prefetch operations for each I/O port with a reduced number of main data lines. In a two bit prefetch operation, a conventional SDR memory device would have two main data lines for each I/O.

In the prior art SDR memory device constructed according to FIG. 1, therefore, eighteen main data lines have been required when each memory cell array block has nine I/Os. For a DDR memory device, the number of required main data lines doubles. Therefore, thirty-six main data lines have been required when each memory cell array block has nine I/Os.

According to the embodiments of this invention described above, the number of main data lines can be reduced to half the number required by the prior art through the use of the pass/latch part 40–40n. A DDR two-bit prefetch system with nine I/Os can therefore be constructed with only eighteen main data lines according to this invention, rather than thirty-six as required by the prior art.

In a DDR memory device for performing a four bit prefetch operation according to this invention, two different methods for providing four bit burst data through two periods will be described below. In one method, the memory device is configured with only eighteen main data lines and transmits one data segment during each half period four times. Since this transmission rate may be difficult to obtain in a high speed memory device, however, a second method is also contemplated in which a memory device is configured having thirty-six data lines. In this second method, the memory device transmits two data segments during each period. A conventional memory device for transmitting four data segments at one time requires seventy-two main data lines.

Further, this invention also offers improvements for executing a two bit or a four bit prefetch operation in an SDR memory device, where only one data segment is output per period through a single I/O. An SDR embodiment of this invention reads data from the memory cell once during each period. Because a period in a high speed operation is too short to perform all the desired read operations, several bits of data are read in at one time using a latency of a first period. Each data bit is then outputted through the main data line. The number of main data lines for this embodiment can therefore also be minimized.

All three embodiments described above can be implemented using the general construction shown in FIGS. 2 and 3. Although the embodiment shown in FIG. 3 is constructed for performing a two bit prefetch operation, variations can be made to adapt it for other uses. For instance, various other features can be implemented using the latch control signals LATCH and LATCHB. Control signals CELL and CELLB can also be used to control the operational timing of the device.

Figure 4:
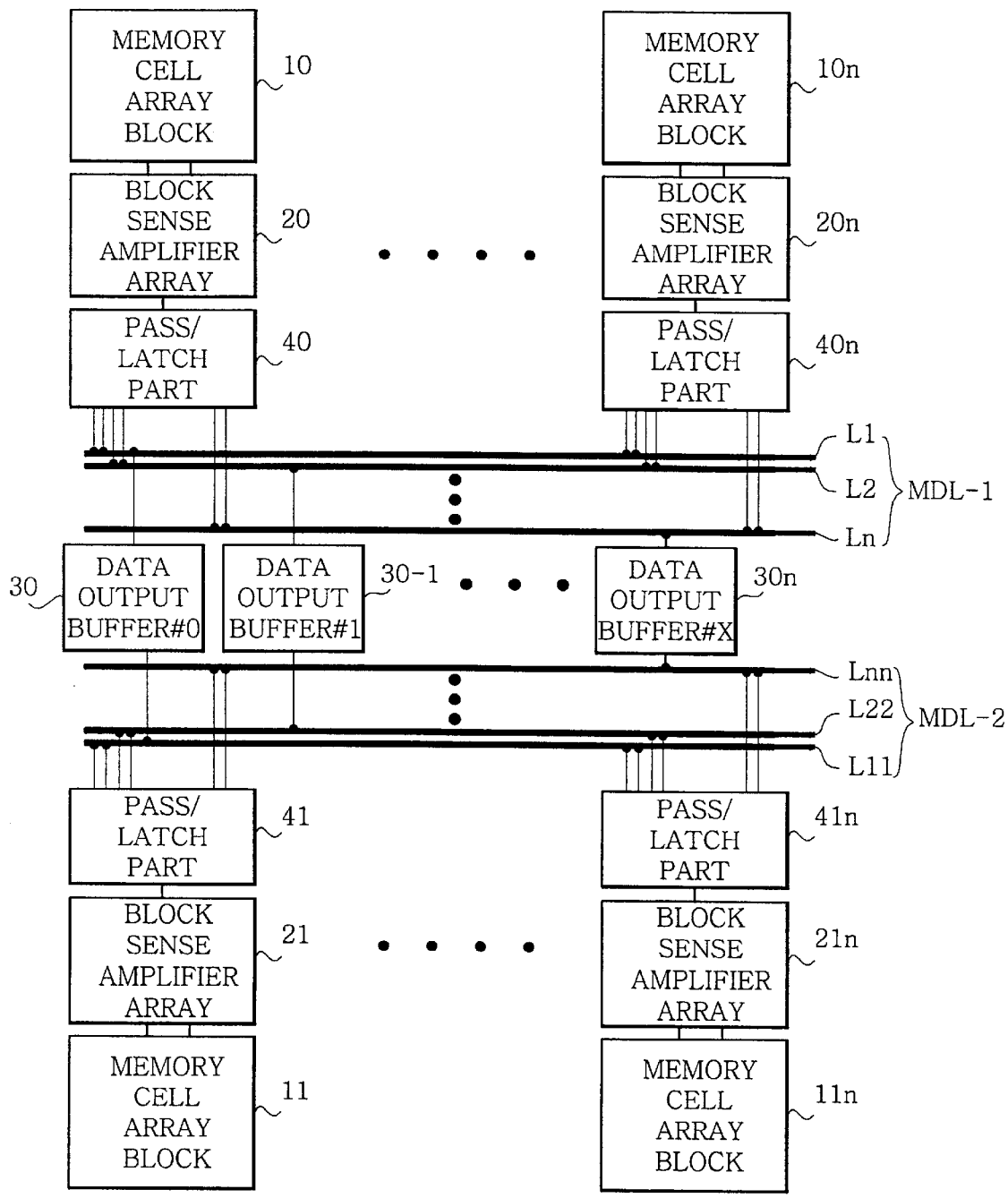
FIG. 4 is a block diagram illustrating the general construction of a read circuit of a semiconductor memory device in accordance with another preferred embodiment of the present invention.

Furthermore, to convert the two bit prefetch construction of the pass/latch part 40 shown in FIG. 3 into a four bit prefetch embodiment, two more data paths are added. A total of four data paths are therefore provided through each pass/latch part 40 to provide a four bit prefetch capability. Alternatively, as shown in FIG. 4, a further embodiment of this invention having a four bit prefetch capability can be provided using the same basic two path construction of FIG. 3 by forming a symmetric structure centered around the data output buffers 30–30n. Specifically, a second set of memory cell array blocks 11–11n, block sense amplifier arrays 21–21n, pass/latch parts 41–41n, and main data lines L11–Lnn are provided on an opposite side of the data output buffers 30–30n.

Referring to FIG. 4, the first set of memory cell array blocks 10–10n, block sense amplifier arrays 20–20n, pass/latch parts 40–40n, and main data lines L1–Ln are mirrored by a second set of memory cell array blocks 11–11n, block sense amplifier arrays 21–21n, pass/latch parts 41–41n, and main data lines L11–Lnn, across the data output buffers 30–30n. This embodiment permits the execution of a four bit prefetch operation with pass/latch parts 40–40n and 41–41n each having only two data paths. The pass/latch parts 40–40n and 41–41n each receive cell data individually provided from corresponding block sense amplifiers and transmit the cell data in series to a corresponding one of the main data lines of the first and second main data lines MDL-1 and MDL-2. The number of main data lines in this four bit prefetch embodiment is only twice that of the two bit prefetching embodiment shown in FIG. 2 and is still substantially reduced from the amount required in the prior art.

In summary, a pass/latch part according to this invention receives a plurality of cell data segments in parallel from respective block sense amplifiers and transmits them in series to a corresponding main data line. In this manner, the number of main data lines required in a semiconductor memory device is minimized. By decreasing the number of main data lines required to perform a prefetch operation, this invention reduces an area occupied by the memory device on a chip as well as its production cost and peak electric current.

It will be apparent to those skilled in the art that various modifications and variations can be made in the present invention without deviating from the spirit or scope of the invention. Thus, this invention covers all modifications and variations within the spirit or scope of the appended claims and their equivalents. Among other things, for example, additions or reductions in the number of data paths of the pass/latch part shown in FIG. 3 is within the contemplation of this invention and this invention is not limited to any particular number thereof. Numerous changes to the connective relationships between the latch and transmission gate of the pass/latch part are also contemplated and are within the spirit and scope of the following claims.

What is claimed is:

1. A synchronous semiconductor memory device comprising:

a plurality of main data lines, each main data line coupled between one of a plurality of block sense amplifier arrays and one of a plurality of data output buffers, and each of said main data lines configured to prefetch a plurality of cell data segments from a plurality of memory cells corresponding to an input/output port and transmit the data segments to a corresponding data output buffer; and a pass/latch part coupled to a plurality of corresponding block sense amplifiers within a corresponding block sense amplifier array, said pass/latch part configured to receive the plurality of cell data segments from the corresponding block sense amplifiers in parallel in response to a plurality of control signals applied to the pass/latch part, and said pass/latch part further configured to transmit the cell data segments to a corresponding main data line in series.

2. A device according to claim 1, wherein said plurality of cell data segments comprises two cell data segments and wherein the main data line is configured to receive one cell data segment two times during a half period of a system clock.

3. A device according to claim 1, wherein said plurality of cell data segments comprises two cell data segments and wherein the main data line is configured to receive one cell data segment two times during one period of the system clock.

4. A device according to claim 1, wherein said plurality of cell data segments comprises four cell data segments and wherein the main data line is configured to receive one cell data segment four times during one period of the system clock.

5. A device according to claim 1, wherein said plurality of cell data segments comprises four cell data segments and wherein the main data line is configured to receive one cell data segment four times during two periods of the system clock.

6. A pass/latch part for a semiconductor memory device, said pass/latch part comprising:
- a first transmission gate and a second transmission gate configured to transmit corresponding cell data segments among a plurality of cell data segments in response to a first logic state of a pass control signal;
- a third transmission gate and a fourth transmission gate each configured to transmit corresponding cell data in response to a second logic state of the pass control signal;
- a latch operatively connected to one of the second or third transmission gates, said latch configured to receive and latch the data from the second or third transmission gate;
- a fifth transmission gate configured to transmit the cell data received from one of the first or fourth transmission gates to the main data line in response to a first logic state of a cell signal applied to the fifth transmission gate as a control signal; and
- a sixth transmission gate configured to transmit the latched data from the latch to the main data line in response to a first logic state of a latch signal applied as a control signal to the sixth transmission gate when the cell signal is maintained at a second logic state.

7. A pass/latch part according to claim 6, further comprising a first data path configured through the first transmission gate and the fifth transmission gate.

8. A pass/latch part according to claim 6, further comprising a second data path configured through the second transmission gate, the latch, and the sixth transmission gate.

9. A pass/latch part according to claim 6, further comprising a first data path and a second data path connected between one or more block sense amplifiers and a main data line and wherein the pass/latch part is configured to transmit a first cell data segment through the first data path during a first time segment and is further configured to transmit a second cell data segment through the second data path during a second time segment.

10. A semiconductor memory device capable of performing a four bit prefetch operation, said device comprising:
- a plurality of main data lines configured to prefetch a plurality of cell data segments from a plurality of memory cells corresponding to each of a plurality of input/output ports in a plurality of memory cell array blocks, each main data line coupled between one of a plurality of block sense amplifier arrays and one of a plurality of data output buffers;
- said plurality of block sense amplifier arrays, memory cell array blocks, and main data lines each comprising symmetrical pairs, each pair arranged symmetrically about a corresponding one of the data output buffers;
- a plurality of pass/latch parts comprising symmetrical pairs, each pair arranged symmetrically about a corresponding one of the data output buffers, said pass/latch parts each being connected to one or more corresponding block sense amplifiers within one of the plurality of block sense amplifier arrays, said pass/latch part configured to receive two or more cell data segments in parallel from the block sense amplifiers and to transmit them in series to the corresponding main data lines.

11. A semiconductor memory device according to claim 10, wherein each pass/latch part comprises two or more data paths.

12. A semiconductor memory device according to claim 11, wherein each pass latch part is configured to transmit a cell data segment through one of the data paths during each respective time segment.

13. A semiconductor memory device according to claim 10, wherein each pass/latch part comprises a plurality of transmission gates and at least one latch, and wherein said pass/latch part is configured to transmit data to the main data line and to latch cell data segments within the pass/latch part in response to one or more control signals.

14. A method for transmitting data in a synchronous semiconductor memory device, said device comprising a plurality of main data lines each coupled between a block sense amplifier array and a data output buffer and configured to prefetch a plurality of cell data segments from memory cells corresponding to an input/output port, said method comprising:
- receiving the plurality of cell data segments in parallel into a pass/latch part from corresponding block sense amplifiers within the block sense amplifier array; and
- transmitting the received plurality of cell data segments from the pass/latch part in series to a corresponding main data line in response to one or more control signals.

15. A method for transmitting data according to claim 14, wherein transmitting the received plurality of cell data comprises transmitting a first cell data segment to the main data line during a first period and transmitting a second cell data segment to the main data line during a second period.

16. A method for transmitting data according to claim 14, wherein transmitting the received plurality of cell data comprises transmitting a first cell data segment to the main data line during a first half-period and transmitting a second cell data segment to the main data line during a second half-period.

17. A method for transmitting data according to claim 14, wherein receiving the plurality of cell data segments in parallel comprises receiving the plurality of cell data segments into separate inputs of the pass/latch part.

18. A method for transmitting data according to claim 14, wherein transmitting the received plurality of cell data comprises transmitting a first cell data segment to the main data line through a first data path during a first segment of time.

19. A method for transmitting data according to claim 18, wherein transmitting the received plurality of cell data further comprises latching a second cell data segment and transmitting the second cell data segment to the main data line through a second data path during a second segment of time.

20. A method for transmitting data according to claim 19, wherein transmitting the second cell data segment to the main data line takes place in response to a latch control signal.

* * * * *